United States Patent
Katine

(10) Patent No.: US 9,620,562 B2
(45) Date of Patent: Apr. 11, 2017

(54) VOLTAGE-CONTROLLED MAGNETIC ANISOTROPY SWITCHING DEVICE USING AN EXTERNAL FERROMAGNETIC BIASING FILM

(71) Applicant: HGST Netherlands B.V., Amsterdam (NL)

(72) Inventor: Jordan A. Katine, Mountain View, CA (US)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 14/728,788

(22) Filed: Jun. 2, 2015

(65) Prior Publication Data

US 2016/0358973 A1    Dec. 8, 2016

(51) Int. Cl.

| | |
|---|---|
| *H01L 43/02* | (2006.01) |
| *H01L 27/22* | (2006.01) |
| *G11C 11/16* | (2006.01) |
| *H01L 43/08* | (2006.01) |
| *H01L 43/10* | (2006.01) |
| *H01L 43/12* | (2006.01) |

(52) U.S. Cl.
CPC .......... *H01L 27/222* (2013.01); *G11C 11/161* (2013.01); *H01L 43/02* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | |
|---|---|---|
| 5,729,410 A | 3/1998 | Fontana, Jr. et al. |
| 6,114,719 A | 9/2000 | Dill et al. |
| 7,777,261 B2 | 8/2010 | Huai et al. |

(Continued)

FOREIGN PATENT DOCUMENTS

| | | |
|---|---|---|
| WO | 2014022304 A1 | 2/2014 |
| WO | 2014025838 A1 | 2/2014 |

OTHER PUBLICATIONS

Weigang Wang, Voltage controlled magnetic anisotropy in magnetic tunnel junctions, Hageman, S. & Chien, C. L. Electric-field-assisted switching in magnetic tunnel junctions. Nature Materials 11, 64 (2012) <http://www.researchgate.net/publication/258755316_Voltage_controlled_magnetic_anisotropy_in_magnetic_tunnel_junctions>.

(Continued)

*Primary Examiner* — Ali Naraghi
(74) *Attorney, Agent, or Firm* — Patterson & Sheridan, LLP

(57) ABSTRACT

Aspects of the present disclose related to a voltage-controlled magnetic anisotropy (VCMA) switching device using an external ferromagnetic biasing film. Aspects of the present disclose provide for a magnetoresistive random access memory (MRAM) device. The MRAM device generally includes a substrate, at least one magnetic tunnel junction (MTJ) stack disposed on the substrate, wherein the MTJ stack comprises a tunnel barrier layer between a first ferromagnetic layer having a fixed magnetization and a second ferromagnetic layer having unfixed magnetization, and a magnet disposed adjacent to the second ferromagnetic layer.

17 Claims, 6 Drawing Sheets

(56) References Cited

U.S. PATENT DOCUMENTS

| | | | | |
|---|---|---|---|---|
| 2012/0002463 A1* | 1/2012 | Ranjan | ................... | B82Y 10/00 |
| | | | | 365/158 |
| 2012/0018788 A1* | 1/2012 | Zheng | ..................... | G11C 11/16 |
| | | | | 257/295 |
| 2014/0071732 A1 | 3/2014 | Khalili Amiri et al. | | |
| 2014/0169085 A1 | 6/2014 | Wang et al. | | |
| 2014/0233306 A1* | 8/2014 | Kent | ....................... | G11C 11/16 |
| | | | | 365/158 |
| 2014/0269040 A1 | 9/2014 | Abedifard et al. | | |

OTHER PUBLICATIONS

J. G. Alzate et al, Voltage-Induced Switching of Nanoscale Magnetic Tunnel Junctions <http://www.google.co.in/url?sa=t&rct=j&q=&esrc=s&source=web&cd=4&ved=0CDEQFjAD&url=http%3A%2F%2Fneuromorphs.net%2Fnm%2Fraw-attachment%2Fwiki%2F2013%2Fetc13%2FIEDM12-Alzate.pdf&ei=FSitVNDHBILmaMLegdgE&usg=AFQjCNErW1oV1N8Cug4SNJRQITYI0zY2Uw&bvm=bv.83134100,d.bGQ&cad=rja>.

* cited by examiner

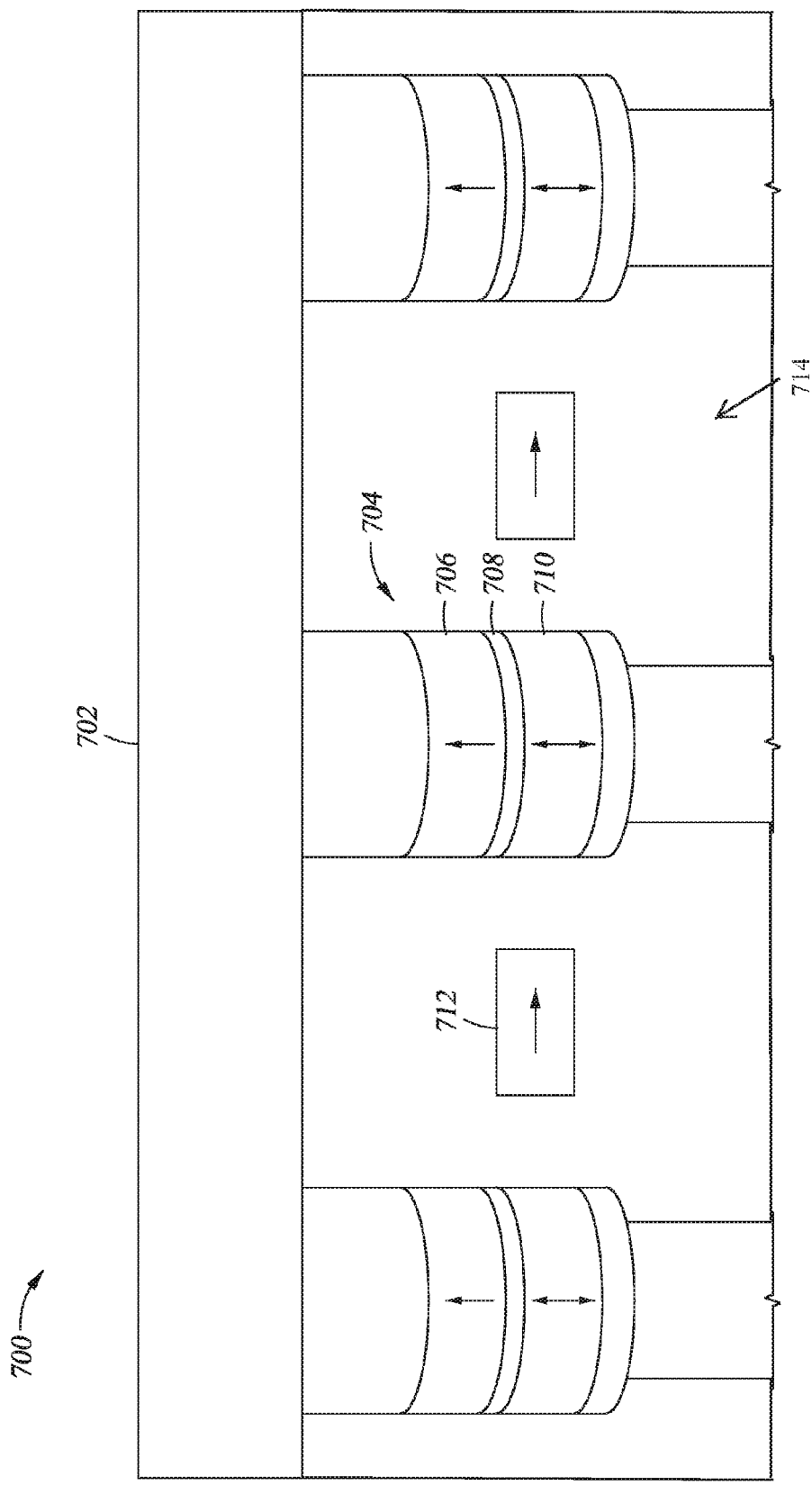

VOLTAGE-CONTROLLED MAGNETIC ANISOTROPY SWITCHING DEVICE USING AN EXTERNAL FERROMAGNETIC BIASING FILM

BACKGROUND

Field of the Disclosure

Aspects of the present disclosure generally relate to data storage systems, and more particularly, to a voltage-controlled magnetic anisotropy (VCMA) switching device using an external ferromagnetic biasing film.

Description of the Related Art

Modern electronic devices increasingly incorporate significant amounts of solid state memory. The electronics industry continually seeks for higher density devices that provide low power consumption. Magnetic memory devices by their nature provide non-volatile characteristics, and are drawing increasing attention as a next generation memory type.

Higher storage bit densities in magnetic media used in disk drives have reduced the size (volume) of magnetic bits. Magnetic random access memory (MRAM) offers fast access time, infinite read/write endurance, radiation hardness, and high storage density. Unlike conventional RAM chip technologies, MRAM data is not stored as electric charge, but is instead stored by magnetic polarization of storage elements. MRAM cells including magnetic tunnel junction (MTJ) memory elements can be designed for in-plane or perpendicular magnetization of the MTJ layer structure with respect to the film surface. The elements are formed from two magnetically polarized plates, each of which can maintain a magnetic polarization field, separated by a thin insulating layer, which together form a MTJ stack. FIG. 1 is a diagram illustrating an example MTJ stack 100, according to certain aspects of the present disclosure. As shown in FIG. 1, one of the two plates is a permanent magnet 102 (i.e., has fixed magnetization) set to a particular polarity; the polarization of the other plate 106 will change (i.e., has free magnetization) to match that of a sufficiently strong external field. Therefore, the cells have two stable states that allow the cells to serve as non-volatile memory elements.

A memory device may be built from a grid of such cells. The MRAM cells in an array on a chip are connected by metal word and bit lines. Each memory cell is connected to a word line and a bit line. The word lines connect rows of cells, and bit lines connect columns of cells. Typically complementary metal-oxide semiconductor (CMOS) structures include a selection transistor which is electrically connected to the MTJ stack through the top or bottom metal contacts. The direction of the current flow is between top or bottom metal electrodes.

Reading the polarization state of an MRAM cell is accomplished by measuring the electrical resistance of the cell's MTJ. A particular cell is conventionally selected by powering an associated transistor that switches current from a supply line through the MTJ layer to a ground. Due to the tunneling magnetoresistance effect, where quantum tunneling of electrons through the tunneling barrier layer 104 occurs, the electrical resistance of the cell changes due to the relative orientation of the polarizations in the two magnetic layers of the MTJ. By measuring the resulting current, the resistance inside any particular cell can be determined, and from this the polarity of the free writable (free) layer determined. If the two layers have the same polarization, this is considered to mean State "0", and the resistance is "low," While if the two layers are of opposite polarization the resistance will be higher and this means State "1". Data is written to the cells using a variety of techniques.

In conventional MRAM, an external magnetic field is provided by current in a wire in proximity to the cell, which is strong enough to align the free layer. Spin-transfer-torque (STT) MRAM uses spin-aligned ("polarized") electrons to directly torque the domains of the free layer. Such polarized electrons flowing into the free layer exert a sufficient torque to realign (e.g., reverse) the magnetization of the free layer.

Magnetoresistive RAM (MeRAM) uses the tunneling magnetoresistance (TMR) effect for readout in a two-terminal memory element, similar to other types of MRAM. However, the writing of information is performed by VCMA at the interface of the tunnel barrier and the free layer, as opposed to current-controlled (e.g. STT or spin-orbit torque, SOT) mechanisms. In VCMA devices, magnetic properties are controlled by the application of an electric field. VCMA devices are based on electric-field-induced switching of nanomagnets. MeRAM devices have the potential for dramatic reductions in power dissipation. By eliminating the need for currents to operate the device, Ohmic dissipation is significantly reduced, resulting in a very low dynamic (i.e. switching) energy dissipation. In addition to reduced power dissipation, the use of electric fields for writing in MeRAM offers an advantage in terms of enhanced bit density. In particular, magnetoelectric writing does not impose a current-drive-based size limit on the access devices (e.g. transistors) when integrated in a circuit, hence allowing for much smaller overall cell area. At the same time, MeRAM in principle retains all key advantages of STT-MRAM, namely high endurance, high speed, radiation hardness, and possibility for nonvolatile operation.

Accordingly, a need exists for high density and high energy efficient magnetic memory devices.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Aspects of the present disclosure generally relate to data storage systems, and more particularly, to a VCMA switching device using an external ferromagnetic biasing film.

In one aspect, a MRAM device is provided. The MRAM device generally includes a substrate, at least one MTJ stack disposed on the substrate, wherein the MTJ stack comprises a tunnel barrier layer between a first ferromagnetic layer having a fixed magnetization and a second ferromagnetic layer having unfixed magnetization, and a magnet disposed adjacent to the second ferromagnetic layer.

In another aspect, a method for fabricating a MRAM device is provided. The method generally includes forming at least one MTJ stack on a substrate, wherein the MTJ stack comprises a tunnel barrier layer between a first ferromagnetic layer having a fixed magnetization and a second ferromagnetic layer having unfixed magnetization and disposing a magnet adjacent to the second ferromagnetic layer.

In yet another aspect, a MRAM device is provided. The MRAM device generally includes a substrate, at least one MTJ stack disposed on the substrate, wherein the MTJ stack comprises a tunnel barrier layer between a first ferromagnetic layer having a fixed magnetization and a second ferromagnetic layer having unfixed magnetization, a passivation layer formed on the substrate, wherein the passivation layer fills in space between MTJs, and a magnet disposed in the passivation layer adjacent to the second ferromagnetic layer, wherein the magnet comprises a ferromagnetic biasing layer disposed horizontally parallel to the substrate and aligned with the second ferromagnetic layer, and wherein the magnetization of the second ferromagnetic layer precesses about a bias field from the magnet when a bias voltage is applied to the MTJ stack such that a magnetic polarity of the MTJ stack is reversed when an electrical field is applied to the MTJ stack.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 7 is a diagram illustrating an example MRAM device having an MTJ stack with an external magnetic biasing layer, according to certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
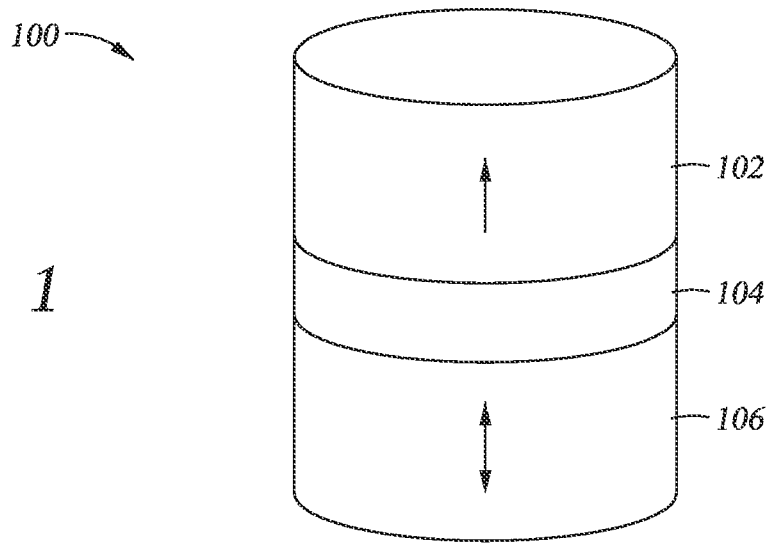
FIG. 1 is a diagram illustrating an example MTJ stack, according to certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Aspects of the present disclosure generally relate to a VCMA switching device using an external ferromagnetic biasing film. For example, as will be discussed in more detail herein, at least one MTJ stack may be formed on a substrate. The MTJ stack(s) may include a tunnel barrier layer between a first ferromagnetic layer having a fixed magnetization and a second ferromagnetic layer having unfixed magnetization. An external magnet (e.g., a ferromagnetic biasing layer) may be disposed adjacent to the second ferromagnetic layer.

In the following description of aspects of the present disclosure, reference is made to the accompanying drawings that form a part hereof, and in which is shown by way of illustration of the specific implementations in which the disclosure may be practiced. It should be noted that the figures discussed herein are not drawn to scale and do not indicate actual or relative sizes. Any hatching in the figures is used to distinguish layers and does not represent the type of material used. A plurality of arrays of MRAM cells are typically fabricated simultaneously on a single wafer. The figures and description herein reference only a few cells of the plurality of cells that will be typically be fabricated simultaneously on a single wafer.

EXAMPLE VCMA-SWITCHING DEVICE

In metallic ferromagnetic films such as those typically used in MTJ devices, electric fields are screened by the conductivity of the material and hence only penetrate a few Angstroms into the film surface. Hence, the strength of the electric field near the surface is in principle a limitation for electric field control of magnetic properties. However, by utilizing ultrathin (e.g., <2 nm) ferromagnetic films, the magnetic properties may be sensitive to, or even dominated by, interface effects, hence providing a mechanism for coupling the applied electric field to the magnetic anisotropy of the material. Thus, manipulating metallic ferromagnets via voltage-controlled interfacial perpendicular magnetic anisotropy (PMA) can be used to realize electric-field controlled magnetic devices.

The VCMA effect can be explained in terms of the electric-field-induced change of occupancy of atomic orbitals at the interface, which, in conjunction with spin-orbit interaction, results in a change of anisotropy.

Figure 2:
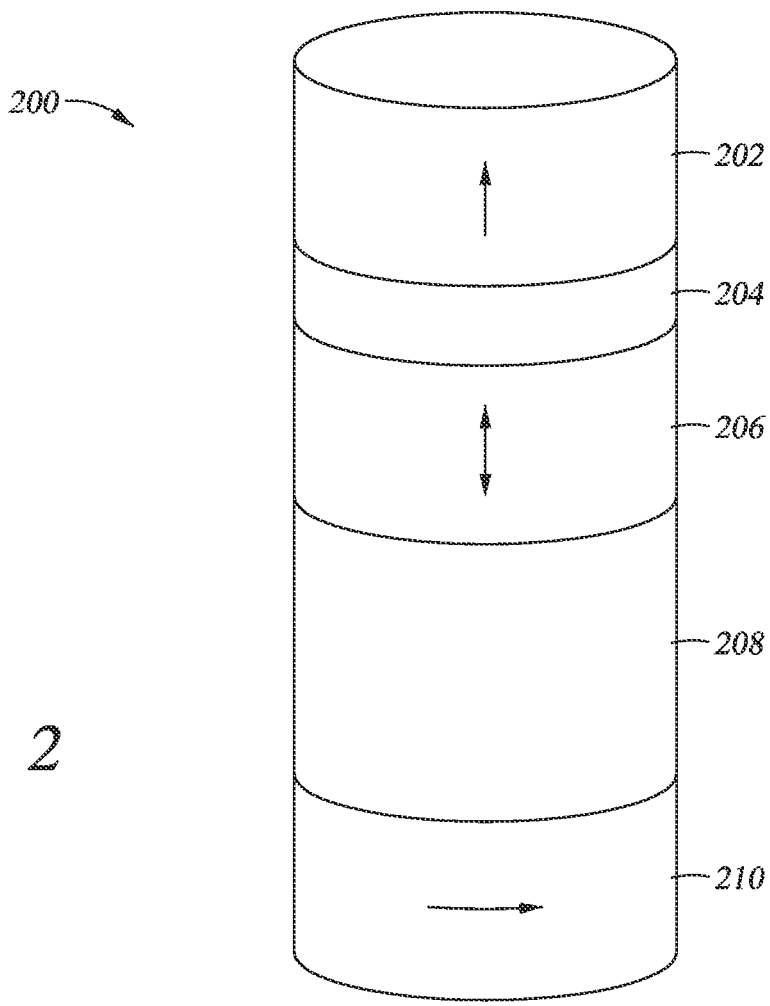
FIG. 2 is a diagram illustrating an example MTJ stack with an in-stack magnetic biasing layer.

FIG. 2 is a diagram illustrating an example MTJ stack 200 with an in-stack magnetic biasing layer. As shown in FIG. 2, the MTJ stack 200 includes a fixed layer 202, a tunnel barrier layer 204, a free layer 206, a passivation layer 208, and an in-stack magnetic biasing layer 210. One example of an MTJ stack may include CoFeB magnetic layers 202 and 206 and MgO as the tunnel barrier layer 204. CoFeB-MgO MTJs (or other similar type MTJs) exhibit voltage-controlled magnetic anisotropy (VCMA) where an electric field changes the density of electrons at the CeFeB/MgO interface and affects the perpendicular anisotropy. For example, a decrease in the electron density at the interface increases perpendicular anisotropy. Since this magnetoelectric coupling is not strain-mediated, it is not endurance limited, making it compatible with logic and memory applications.

Figure 3:
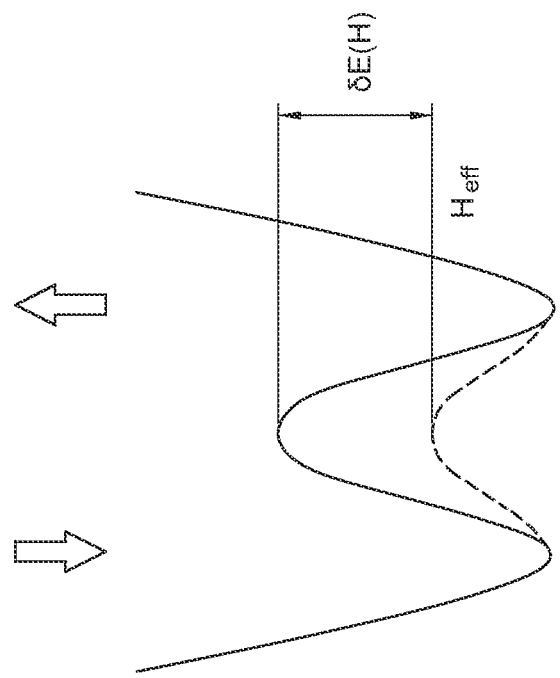
FIG. 3 illustrates application of a magnetic field to adjust an energy barrier, according to certain aspects of the present disclosure.
Figure 3:
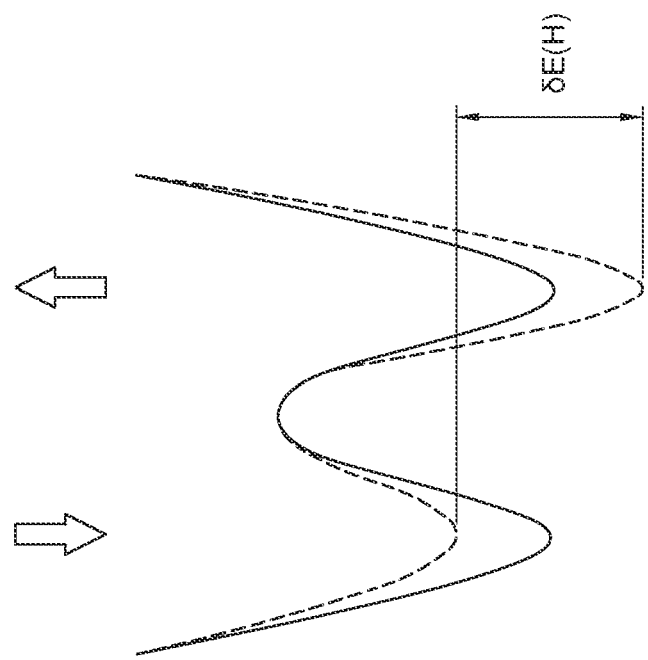
Figure 4:
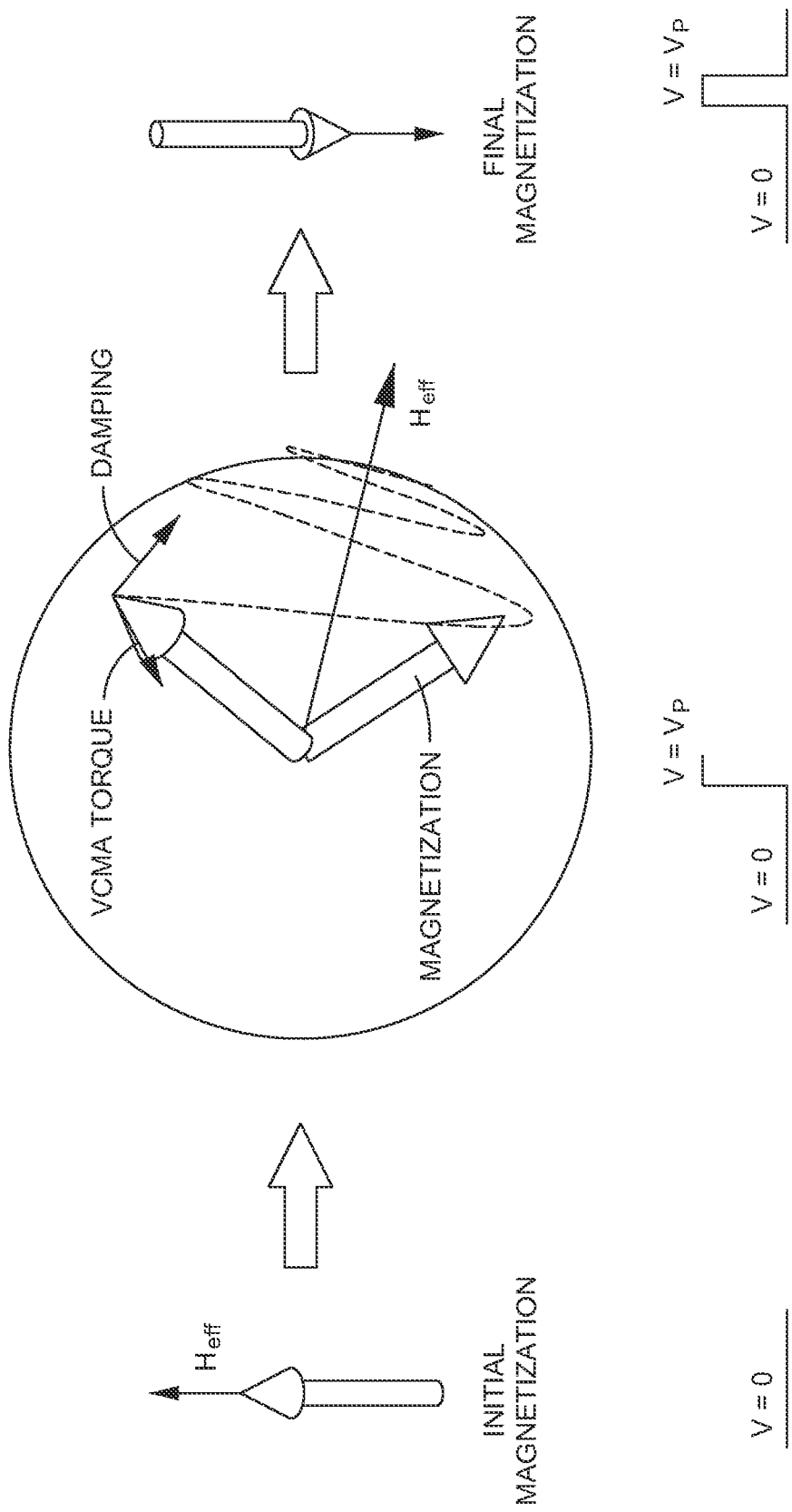
FIG. 4 illustrates switching magnetic polarity by applying a voltage, according to certain aspects of the present disclosure.

An external magnetic field tilts the energy barrier orientation, while the voltage controlled anisotropy either reduces or increases the energy barrier, depending on the polarity. FIG. 3 illustrates application of a magnetic field to adjust an energy barrier, according to certain aspects of the present disclosure. Adjusting the energy barrier may enable deterministic switching when a voltage (pulse) is applied as illustrated in FIG. 4. For example, as shown in FIG. 4, an MTJ may have a free layer magnetization aligned to an initial magnetization $H_{eff}$. In this example, $H_{eff}$ points up and is dominated by the interfacial out-of-plane anisotropy. The application of a voltage results in an electric field through the MgO barrier and reduces the interfacial anisotropy. This reconfiguration of the magnetic anisotropy of the free layer via the VCMA effect is allows for switching using electric fields; in other words, the reduction of the coercivity due to the VCMA effect is exploited to switch the magnetization of the free layer of our VMTJs without the influence of spin-polarized currents. As shown in FIG. 4, when a voltage pulse $V_p$ is applied, the effective field $H_{eff}$ influencing the free layer tilts in plane because the interfacial anisotropy field is reduced and now $H_{eff}$ is dominated by the biasing field from the in-stack layer 210. The magnetization of the free layer will precess about $H_{eff}$, until it eventually aligns with $H_{eff}$. Damping is low enough in the system, that many oscillations will occur before precession stops. The precession can be interrupted by turning off Vp, which can result in final magnetization state which has the opposite polarity from the initial magnetization direction.

Such electric-field-controlled MTJs may be compatible with complementary metal-oxide semiconductor (CMOS) integration. Read-out may be performed via the TMR effect and electrical write may be performed via electric fields using VCMA. The write may be a resonant (precessional) at less than 1 ns, for example. Bits may be perpendicular for scalability and density.

Figure 5:
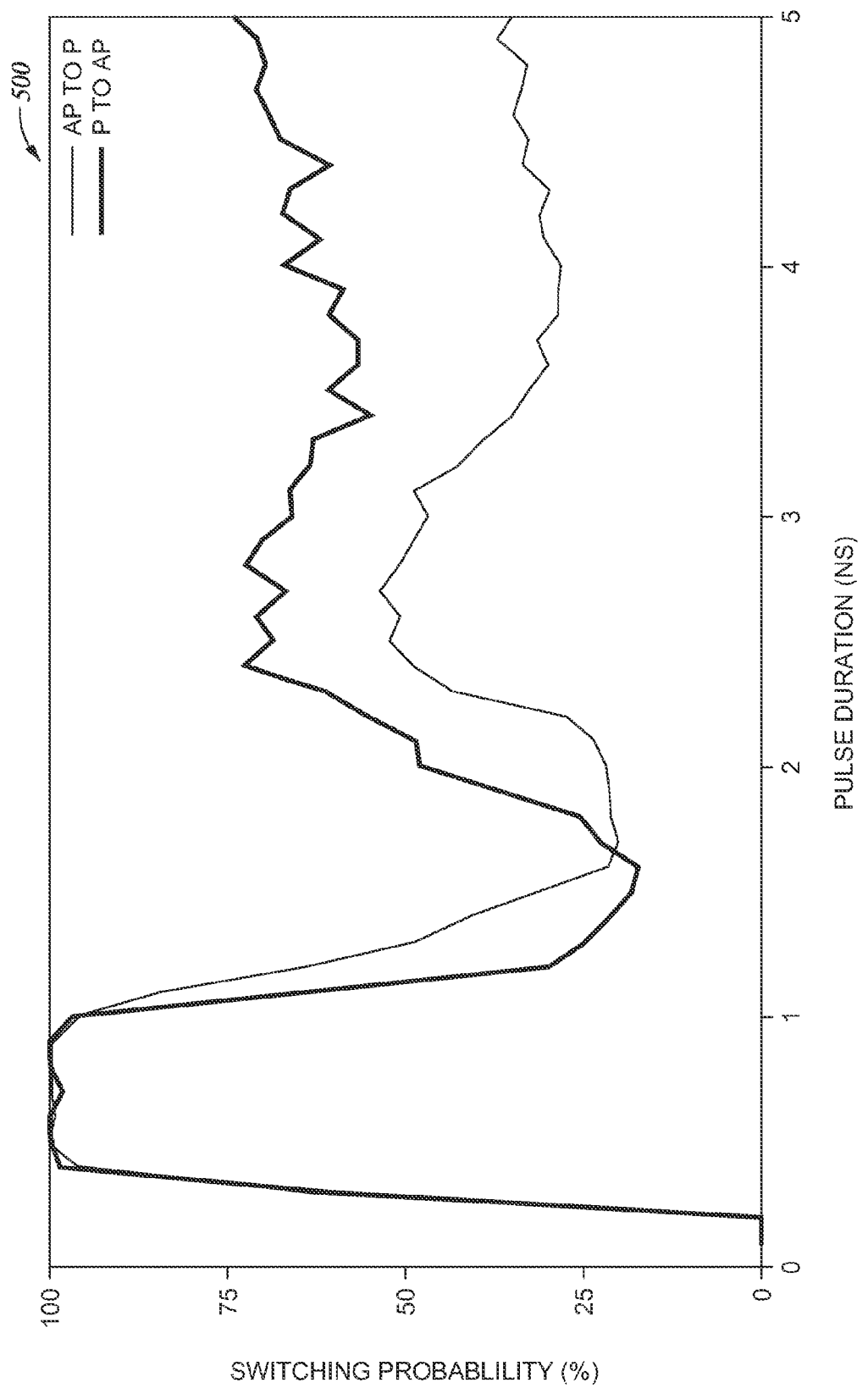
FIG. 5 is graph illustrating example VCAM-driven writing with TMR readout for a perpendicular MTJ device using an in-stack biasing field.

FIG. 5 is graph 500 showing VCMA-driven writing with TMR readout for a perpendicular 80 nm×80 nm MTJ device using an in-stack biasing field. As shown in FIG. 5, 100% switching may be achieved (e.g., in a time window of around 700 ps±250 ps). In this example, the switching energy may be around 10 fJ/bit with a write time<1 ns. Since this precessional VCMA-switching is a toggle rather than deterministic operation (i.e., switching occurs each time a VCMA pulse is applied), a read may be done before and/or after switching in order to determine the polarity of the bits, and whether the toggle pulse should be applied.

Conventionally, the magnetic field is provided by an in-stack magnetic biasing layer, such as the in-stack magnetic biasing layer 210 shown in FIG. 2.

EXAMPLE VCMA-SWITCHING DEVICE USING AN EXTERNAL FERROMAGNETIC BIASING LAYER

According to certain aspects of the present disclosure, a magnetic tunnel junction (MTJ) device with an external (e.g., as opposed to in-stack) magnet (e.g., biasing layer) is described. Use of an external (e.g., permanent) magnet may allow for simpler stack.

Figure 6:
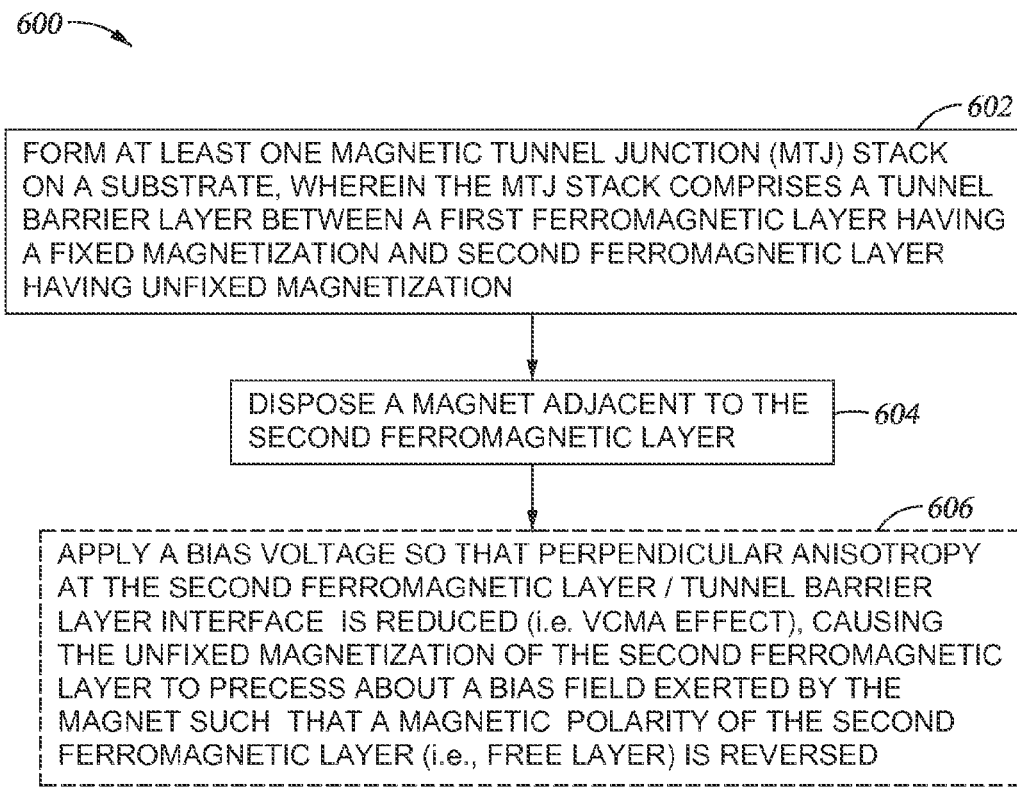
FIG. 6 is a block diagram illustrating example operations for fabricating a MRAM device, according to certain aspects of the present disclosure.

FIG. 6 is a call flow illustrating example operations 600 for fabricating a MRAM device, in accordance with certain aspects of the present disclosure. For example, the operations 600 may be used to fabricate the MRAM device 700 illustrated in FIG. 7.

At 602, at least one MTJ stack (e.g., such MTJ stack 704) may be formed on a substrate (e.g., substrate 702), wherein the MTJ stack comprises a tunnel barrier layer (e.g., tunnel barrier layer 708 which may be an MgO layer) between a first ferromagnetic layer (e.g., a CoFeB layer) having a fixed magnetization (e.g., fixed layer 706) and a second ferromagnetic layer (e.g., a CoFeB layer) having unfixed magnetization (e.g., free layer 710).

At 604, a magnet (e.g., external magnet 712) may be disposed (e.g., formed) adjacent to the second ferromagnetic layer. According to certain aspects, the magnet may be disposed in a passivation layer deposited on the substrate to prevent shorting (e.g., after milling the device). According to certain aspects, the magnet may be a ferromagnetic biasing layer (e.g., a hard material such as a CoPt layer or a soft material such as a NiFe layer pinned by an antiferromagnet) formed on the substrate (e.g., a wafer). As shown in FIG. 7, the external magnet 712 may be formed horizontally parallel to the substrate 702 and aligned with the free layer 710.

At 606, a bias voltage is applied to the MTJ stack so that the perpendicular anisotropy at the free layer/barrier interface is reduced (i.e., the VCMA effect), causing the magnetization of the free layer to precess about the effective field—now dominated by the field created by the bias magnet. The pulse duration can be optimized to halt the precession such that the magnetic polarity of the free layer is reversed. According to certain aspects, the thickness of the disposed magnet and/or the distance of the disposed magnet from the second ferromagnetic layer may be selected when fabricating the device such that a desired (e.g., optimal) magnetic field will be exerted on the MTJ stack by the magnet.

According to certain aspects, the external magnet may be disposed using Ion Beam Deposition (IBD), electroplating, sputtering, or other technique for depositing.

FIG. 7 is a diagram illustrating the example MRAM device 700 having an MTJ stack 704 with an external magnet 712, according to certain aspects of the present disclosure. According to certain aspects, when an electrical field (e.g., a VCMA pulse) is applied to the MTJ stack, the magnetization of the free layer may precess around the permanent biasing field (provided by the external magnet). Optimization of the moment and thickness of the external magnet may be used to provide a desirable precessional field. For example, using a stronger magnetic field may provide for a faster time of the precession.

According to certain aspects, use of an external magnetic field may lead to improved magnetic field control, the ability to use larger magnetic fields, the ability to etch the MTJ stack more easily, and simpler magnetics. Additionally, because the layers may be thinner and easier to etch through, a narrower final pitch may be used. Further, in-stack magnets may require a large in-plane field annealing field to set their direction, which may be unfavorable for free layer properties and for perpendicular anisotropy. Additionally, it is to be understood that while a permanent magnetic with high coercivity (hard magnet) has been shown for the external magnet 712, a low coercivity (soft magnet) coupled to an antiferromagnetic biasing layer could also be used.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various operations of methods described above may be performed by any suitable means capable of performing the corresponding functions. The means may include various hardware and/or software component(s).

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A magnetoresistive random access memory (MRAM) device, comprising:
    a substrate;
    a passivation layer disposed on the substrate;
    at least one magnetic tunnel junction (MTJ) stack disposed on the substrate, wherein the MTJ stack comprises a tunnel barrier layer between a first ferromagnetic layer having a fixed magnetization and a second ferromagnetic layer having unfixed magnetization; and
    a magnet disposed in the passivation layer and adjacent to the second ferromagnetic layer, wherein the magnet is an external magnet to the stack and is horizontally parallel to the substrate and aligned with the second ferromagnetic layer.

2. The MRAM device of claim 1, wherein the magnet comprises a ferromagnetic biasing layer.

3. The MRAM device of claim 1, wherein the magnet comprises a hard ferromagnetic layer or a soft ferromagnetic layer pinned by an antiferromagnet.

4. The MRAM device of claim 3, wherein the hard ferromagnetic layer comprises CoPt and the soft ferromagnetic layer comprises NiFe.

5. The MRAM device of claim 1, wherein the first ferromagnetic layer and the second ferromagnetic layer comprise CoFeB layers.

6. The MRAM device of claim 1, wherein the tunnel barrier layer comprises an MgO layer.

7. A method for fabricating a magnetoresistive random access memory (MRAM) device, comprising:
    forming at least one magnetic tunnel junction (MTJ) stack on a substrate, wherein the MTJ stack comprises a tunnel barrier layer between a first ferromagnetic layer having a fixed magnetization and a second ferromagnetic layer having unfixed magnetization;
    forming a passivation layer on the substrate; and
    disposing a magnet in the passivation layer and adjacent to the second ferromagnetic layer, wherein the magnet is an external magnet to the stack and is horizontally parallel to the substrate and aligned with the second ferromagnetic layer.

8. The method of claim 7, wherein the magnet comprises a ferromagnetic biasing layer.

9. The method of claim 7, wherein the magnet comprises a hard ferromagnetic layer or a soft ferromagnetic layer pinned by an antiferromagnet.

10. The method of claim 9, wherein the hard ferromagnetic layer comprises CoPt and the soft ferromagnetic layer comprises NiFe.

11. The method of claim 7, wherein the first ferromagnetic layer and the second ferromagnetic layer comprise CoFeB layers.

12. The method of claim 7, wherein the tunnel barrier layer comprises an MgO layer.

13. The method of claim 7, further comprising using a voltage-controlled magnetic anisotropy (VCMA) effect so that the magnetization of the second ferromagnetic layer precesses about a bias field from the magnet such that a magnetic polarity of the second ferromagnetic layer is reversed.

14. The method of claim 13, wherein the magnet adjacent the second ferromagnetic layer is a permanent magnet.

15. A magnetoresistive random access memory (MRAM) device, comprising:
    a substrate;
    at least one magnetic tunnel junction (MTJ) stack disposed on the substrate, wherein the MTJ stack comprises a tunnel barrier layer between a first ferromagnetic layer having a fixed magnetization and a second ferromagnetic layer having unfixed magnetization;
    a passivation layer formed on the substrate, wherein the passivation layer fills in space between MTJs; and
    a magnet disposed in the passivation layer adjacent to the second ferromagnetic layer, wherein the magnet comprises a ferromagnetic biasing layer disposed horizontally parallel to the substrate and aligned with the second ferromagnetic layer, and wherein the magnetization of the second ferromagnetic layer precesses about a bias field from the magnet when a bias voltage is applied to the MTJ stack such that a magnetic polarity of the MTJ stack is reversed when an electrical field is applied to the MTJ stack.

16. The MRAM device of claim 15, wherein the magnet comprises a hard ferromagnetic layer or a soft ferromagnetic layer pinned by an antiferromagnet.

17. The MRAM device of claim 15, wherein the magnet is a permanent magnet.

* * * * *